(12) United States Patent
Matsukura et al.

(10) Patent No.: US 6,740,968 B2
(45) Date of Patent: May 25, 2004

(54) POWER SOURCE UNIT FOR DRIVING MAGNETRON AND HEATSINK TO BE MOUNTED ON PRINTED CIRCUIT BOARD THEREOF

(75) Inventors: Toyotsugu Matsukura, Nara (JP); Shinichi Sakai, Nara (JP); Hisashi Morikawa, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 44 days.

(21) Appl. No.: 10/093,740

(22) Filed: Mar. 8, 2002

(65) Prior Publication Data

US 2002/0141161 A1 Oct. 3, 2002

(30) Foreign Application Priority Data

Mar. 12, 2001 (JP) .......................... 2001-068953
Mar. 13, 2001 (JP) .......................... 2001-069966
Mar. 29, 2001 (JP) .......................... 2001-095750

(51) Int. Cl.$^7$ .......................... H07L 23/10; H01L 23/34
(52) U.S. Cl. .......................... 257/707; 257/706
(58) Field of Search .......................... 257/706, 707, 257/723, 724, 709, 712

(56) References Cited

U.S. PATENT DOCUMENTS 6,058,013 A * 5/2000 Christopher et al.
6,272,015 B1 * 8/2001 Mangtani
6,281,573 B1 * 8/2001 Atwood et al.
6,410,983 B1 * 6/2002 Moriizumie et al.
6,465,728 B1 * 10/2002 McLaughlin et al.
6,515,858 B2 * 2/2003 Rodriguez et al.

* cited by examiner

Primary Examiner—Sheila V. Clark
(74) Attorney, Agent, or Firm—Pearne & Gordon LLP

(57) ABSTRACT

Since the exposed collector part 32 of one semiconductor switching element 29 is attached to the heat radiating fin 42 by coating and filling a thermal conducting filler therebetween via spacers 33, 34 and 35, and the exposed collector part 37 of another semiconductor switching element 36 is directly attached to the same heat radiating fin 42 by coating the thermal conducting filler 41 thereto without any spacer, heat resulting from switching losses can be effectively transmitted to the heat radiating fin 42 and can be radiated therefrom. To effectively transmit heat, which results from switching losses, to a heat radiating fin and to radiate the same even if two semiconductor switching elements are connected in series, a collector part is exposed on the rear side thereof, and the two semiconductor switching elements are attached to a single heat radiating fin.

13 Claims, 10 Drawing Sheets

US 6,740,968 B2

1

POWER SOURCE UNIT FOR DRIVING MAGNETRON AND HEATSINK TO BE MOUNTED ON PRINTED CIRCUIT BOARD THEREOF

BACKGROUND OF THE INVENTION

The present invention relates to a power unit for driving a magnetron in which cooling of the power unit for driving a magnetron is improved in the technical field of a high frequency heating apparatus, such as a microwave oven, for dielectric heating using a magnetron. Furthermore, the present invention relates to the cooling configuration of a plurality of heat sinks assembled on a printed circuit board, wherein power semiconductor devices with non-insulation packages which are located at electric potential differences are mounted on respective said heat sinks.

Conventionally, as shown in FIG. 4, a switching power source used as a power unit for driving a magnetron is such that the semiconductor switching element 1 is attached to a heat radiating fin 2, which is made of aluminum, by a screw 3 in order to prevent the elements from being damaged due to a temperature rise resulting from switching losses of the semiconductor switching element 1, and heat that is generated due to switching losses are thermally transmitted to the heat radiating fin, whereby the heat is radiated from the heat radiating fin 2. Further, in order to efficiently thermally conduct switching losses, which are generated by the semiconductor switching elements 1, to the heat radiating fin 2, the semiconductor switching elements 1 have a collector part exposed on the rear side thereof, a thermal conducting filler having good thermal conductivity is coated and filled between the rear side thereof and the heat radiating fin, and the collector part 4 is brought into contact with the heat radiating fin 2, thereby having improved thermal conduction.

However, a high voltage-resisting semiconductor switching element for a power unit for driving a magnetron has been requested in line with high output of a high frequency heating apparatus. Since the yields of high voltage-resisting semiconductor switching elements are not sufficient and these are expensive, there is a problem in procurement thereof. Therefore, for a power unit for driving a magnetron, circuits that are composed of two versatile medium voltage-resisting semiconductor switching elements connected in series have been used as shown in FIG. 5. That is, the commercially available power supply 5 is rectified to be a direct current by a rectification part 6 and is made into high frequency by a switching portion 9 composed of semiconductor switching elements 7 and 8. The high frequency is boosted by a boosting transformer 10, and is subjected to a voltage doubler rectifier by a high-voltage doubler rectifier circuit part 11. Then, the same is provided to a magnetron 12.

However, in a construction in which semiconductor switching elements are attached to a conventional heat radiating fin, although two semiconductor switching elements 7 and 8 are attached to one heat radiating fin 2, in view of the circuit, a collector terminal part 13 of one semiconductor switching element 7 is connected to an emitter terminal part 14 of the other semiconductor switching element 8, and these are to be held in the same potential. On the other hand, in order to efficiently thermally conduct the switching losses of the semiconductor switching elements 7 and 8 to the heat radiating fin, the collector terminal part 13 of the semiconductor switching element 7 and the collector

2 part of the same potential are exposed on the rear side of the semiconductor switching elements, a thermal conducting filler of good thermal conductivity is coated thereon, and these are brought into contact with the heat radiating fin. However, where the two semiconductor switching elements having the collector parts thereof exposed on the rear side, where thermal conductivity is improved, are attached to one heat radiating fin as they are, the collector parts are made into the same potential, wherein the circuit shown in FIG. 5 cannot be configured.

Therefore, as shown in FIG. 6, it was necessary that the heat radiating fin was divided into heat radiating fins 15 and 16, wherein the semiconductor switching elements 19 and 20 having collector parts 17 and 18 exposed on the rear side thereof were, respectively, attached thereto by screws 21 and 22, and two heat radiating fins were electrically insulated from each other, and the heat radiating fins were not held in the same potential. Or as shown in FIG. 7, in order to attach two semiconductor switching elements 24 and 25 to a single heat radiating fin 23, a semiconductor switching element 24 having a larger switching loss had a collector part 26 exposed on the rear side thereof and the same was attached to the heat radiating fin 23 by a screw 27 while the other semiconductor switching element 25 was electrically insulated with a resin armoring the outside of the collector part on the rear side thereof and was attached to the heat radiating fin 23 with a screw 28.

Thus, since in the former two heat radiating fins are required, and it is necessary that these two heat radiating fins are electrically insulated from each other, there is a problem in that a disadvantage is brought about with respect to the installation plane of the heat radiating fin in view of constituting a power unit for driving a magnetron.

Also, since one of the semiconductor switching elements has the collector part on the rear side thereof electrically insulated with an armoring resin although in the latter the semiconductor switching elements can be attached to a single heat radiating fin, it is difficult to conduct heat resulting from switching losses to the heat radiating fin in view of thermal conductivity, wherein it is necessary to make the heat radiating fin larger in order to secure a sufficient cooling effect or it is necessary to make large a cooling fan for cooling the heat radiating fin. Therefore, there is another problem in that a disadvantage occurs in view of the plane of installation of the heat radiating fin and cooling fan when constituting a power unit for driving a magnetron.

As another method, when attaching, to the heat radiating fin, one of the two semiconductor switching elements having the collector part thereof exposed on the rear side thereof, in which heat conductivity has been improved, a silicon sheet or mica plate having an insulative property and thermal conductivity is caused to intervene and is attached between the semiconductor switching element having the collector part exposed on the rear side thereof and the heat radiating fin 7. However, since the thermal conductivity of the silicon sheet and mica plate is 1.0 through $1.5 \times 10^{-3}$ cal/cm.sec.K, and the thickness thereof is 0.3 through 1.0 mm, it is difficult to conduct heat, which is generated by the semiconductor switching elements, to the heat radiating fin, problems occur in that a necessity of making the heat radiating fin large arises in order to sufficiently cool the semiconductor switching elements, and a cooling fan for cooling the heat radiating fin is made large.

Further, in the prior art of such a heat sink unit for assembly on a printed circuit board, heat sinks at different potentials have been separately attached to a printed circuit board by screws or the like. Alternatively, an insulation sheet has been used for one of the semiconductor devices. FIG. 11 is an assembly diagram showing a prior art heat sink unit for assembly on a printed circuit board in which heat sinks are separately attached to a printed circuit board. FIG. 12 is a wiring print diagram of the printed circuit board.

In FIG. 11, a printed circuit board 1 is provided, thereon, with a first heat sink 103 to which a first power semiconductor device 102 is attached by a screw, and similarly with a second heat sink 105 which is separated therefrom by a predetermined insulation distance and to which a second power semiconductor device 104 is attached by a screw.

As shown in FIG. 12, each heat sink is attached to the printed circuit board 1 by a screw. The wiring print pattern 107 around each screw 106 is separated from the screw 106 by a predetermined insulation distance.

Nevertheless, the prior art has a first design-relevant problem wherein the necessity of insulation separates the heat sinks 103 and 105 into two distinct components. A second problem is that the necessity of the separation and the insulation distance reduces the surface area of the heat sinks 103 and 105 on condition that the arrangement in the printed circuit board 101 is maintained unchanged. A third problem is that the heat sinks 103 and 105 need to be independently attached to the printed circuit board 101. These problems have caused a first difficulty in that the number of assembly processes is increased, and that thereby the workability is reduced. A second difficulty has been that on condition that the arrangement in the printed circuit board 101 is maintained unchanged, the reduction in the heat radiation area reduces the heat radiation efficiency, and that thereby the heat design becomes difficult. A third difficulty has been that the necessity of the insulation distance between the screw 106 and the wiring print pattern restricts the area of the wiring print pattern for large currents. In order to avoid this, the pattern had to be supplemented by lead wires or the like in some cases.

In a case where two power semiconductor devices with non-insulation package are assembled on a single heat sink by means of an insulation sheet, the above-mentioned problems in the number of components and the area of the wiring print pattern are resolved. Nevertheless, a much higher heat resistance of the insulation sheet than that of the non-insulation package causes a large difficulty in heat design.

Furthermore, conventionally, as such another type of switching power supply for a high frequency heating apparatus, for example, those shown in FIG. 15 and FIG. 16 have been generally used. An alternating current of commercial power supply 201 is converted into a DC voltage by rectifier 202, and in response to this DC voltage, inverter circuit 205 generates a high frequency voltage to the primary winding of high voltage transformer 206 by turning switching devices 203 and 204 ON and OFF, and the high voltage transformer 206 excites a high frequency high voltage to the secondary winding. This high frequency high voltage is rectified into a DC high voltage by high voltage rectifying circuit 207, and applied to magnetron 208. The magnetron 208 is driven in response to this DC high voltage, and generates a radio wave of 2.45 GHz.

By the abovementioned operation, the rectifier 202 generates an approximately 15 through 25W loss and the semiconductor switching devices 203 and 204 generate an approximately 30 through 50W loss each. Therefore, for cooling, the rectifier 202 and semiconductor switching devices 203 and 204 are attached to radiation fin 209.

However, in the abovementioned conventional construction, since the semiconductor switching devices 203 and 204 generate a loss twice as much as that of the rectifier 202, in proportion to the loss, each junction temperature of the semiconductor switching devices 203 and 204 naturally becomes much higher than that of the rectifier 202.

Furthermore, since the rectifier 202 and semiconductor switching devices 203 and 204 are attached to the same radiation fin 209, the semiconductor switching devices 203 and 204 receive heat from the rectifier 202 due to heat conduction, and each junction temperature of the semiconductor switching devices 203 and 204 rises further, and sometimes exceeds a temperature that is permissible in terms of reliability. The rectifier 202 also receives heat from the semiconductor switching devices 203 and 204 due to heat conduction, and the junction temperature of the rectifier 202 also rises, however, the loss of the rectifier is originally small, so that the temperature is lower than the temperature that is permissible in terms of reliability. Therefore, in order to restrict each junction temperature of the semiconductor switching devices 203 and 204 within the temperature that is permissible in terms of reliability, semiconductor switching devices 203 and 204 that are expensive although small in loss, and radiation fin 9 with higher cooling performance have been conventionally used, whereby the costs have been high.

To solve such a problem, as shown in FIG. 17, a construction in which the radiation fin is divided into a radiation fin 209a for the rectifier 202 and a radiation fin 209b for the semiconductor switching devices 203 and 204 has been proposed. This case is advantageous since the semiconductor switching devices 203 and 204 do not receive heat from the rectifier 202 and the junction temperature is accordingly suppressed from rising. However, in this construction, the radiation fin is divided into two, the number of assembly processes for manufacturing a switching power supply for a high frequency heating apparatus becomes twice as much, the manufacturing costs increase, so that costs are high all the same.

SUMMARY OF THE INVENTION

The present invention solves these conventional and other problems. It is therefore a first object of the invention to provide a power unit for driving a magnetron, wherein semiconductor switching elements are able to be attached to a single heat radiating fin where a power unit for driving a magnetron is composed of semiconductor switching elements connected to each other in series, two semiconductor switching elements having a collector part having good thermal conductivity to the heat radiating fin and exposed on the rear side thereof are used, the collector part of one of the semiconductor switching elements is electrically insulated from the heat radiating fin with a simplified construction, and heat which is produced by the semiconductor switching elements is radiated by the heat radiating fin at better thermal conductivity.

Further, a second object of the invention is to provide a heat sink unit for assembly on a printed circuit board capable of reducing the number of assembly processes, permitting easy design in the heat radiation of the power semiconductor devices, facilitating the area of the wiring print pattern, and thereby improving the accommodation reliability.

Furthermore, a third object thereof is to provide a switching power supply for a high frequency heating apparatus, which can restrict each junction temperature of semiconductor switching devices within a temperature that is permissible in terms of reliability by a simple and inexpensive structure.

According to a first aspect of the invention, a power unit for driving a magnetron is composed so that the same includes semiconductor switching elements, a heat radiating fin, a spacer, and a thermal conducting filler, wherein said semiconductor switching elements have a collector part exposed on the rear side thereof, the exposed collector part of one semiconductor switching element is coated and filled with said thermal conducting filler via said spacer and is attached to said heat radiating fin, the exposed collector part of another semiconductor switching element is directly coated with said thermal conducting filler with no space intervened, and is attached to the same heat radiating fin, and further the two semiconductor switching elements are connected to each other in series, whereby since the exposed collector part of one semiconductor switching element is electrically insulated from the heat radiating fin by the spacer, and a thermal conducting filler is coated on and filled in the collector part, it becomes possible to effectively conduct heat resulting from switching losses to the heat radiating fin in view of thermal conductivity. Further, since a single heat radiating fin is sufficient in constructing the power unit for driving a magnetron, and heat resulting from switching losses can be effectively transmitted to the heat radiating fin, a cooling fan can be made small.

Preferably, the power unit for driving a magnetron may be constructed so that the two semiconductor switching elements have a collector part exposed thereon, a spacer projecting from the plane of the collector part is constituted on one collector part side thereof, and a thermal conducting filler is coated and filled in an air gap between the collector part of said semiconductor switching elements and the heat radiating fin, whereby since the collector part is electrically insulated from the heat radiating fin in spacing secured by the projecting spacer and a thermal conducting filler is coated on and filled in the collector part, heat resulting from switching losses can be effectively transmitted to the heat radiating fin in view of thermal conductivity. Further, since a single heat radiating fin is sufficient in constructing the power unit for driving a magnetron, and heat resulting from switching losses can be effectively transmitted to the heat radiating fin, the cooling fan can be made small.

Further, preferably, the power unit for driving a magnetron is constructed so that two or more holes are provided in a spacer whose thermal conductivity is 0.5 through $1.5 \times 10^{-3}$ cal/cm.sec.K, and a thermal conducting filler is coated and filled in said holes of the spacer, whereby since a thermal conducting filler is provided into holes secured at the spacer, and heat resulting from switching losses can be effectively transmitted to the heat radiating fin, a single heat radiating fin is sufficient in constructing the power unit for driving a magnetron, and the heat resulting from switching losses can be effectively transmitted to the heat radiating fin, wherein the cooling fan can be made small.

According to the second aspect of the invention, in a heat sink unit for assembly on a printed circuit board, a plurality of heat sinks assembled on a printed circuit board are thermally linked to each other by an insulator having thermal conductivity.

By virtue of this, the heat sinks constitute an apparently single structure, and the heat sinks are thermally linked to each other, whereby the heat radiation efficiency is improved. Further, the area of the wiring print pattern is facilitated.

A plurality of heat sinks assembled on a printed circuit board are thermally linked to each other by an insulator having thermal conductivity. By virtue of this, the heat sinks constitute an apparently single structure, and the heat sinks are thermally linked to each other by the insulator having thermal conductivity. Accordingly, the assembly workability is improved. Further, the heat radiation efficiency is improved.

Preferably, in the heat sink unit for assembly on a printed circuit board, the power semiconductor devices and the heat sinks are attached simultaneously together with the insulator having thermal conductivity by screws or the like. Accordingly, the heat sinks are securely fixed to each other by the insulator.

Preferably, in the heat sink unit for assembly on a printed circuit board, the insulator having thermal conductivity is composed of a metallic material covered with a thin insulator film. Accordingly, the thermal linkage between the heat sinks is improved drastically. This permits easy design in the heat radiation.

Preferably, in the heat sink unit for assembly on a printed circuit board, the heat sinks constitute an apparent single heat sink, whereby the number of screw attachments is reduced between the printed circuit board and the heat sink unit. This facilitates the area of the wiring print pattern, and thereby improves the reliability.

According to third aspect of the invention, a switching power supply for a high frequency heating apparatus comprises a rectifier for rectifying a commercial power supply, at least one semiconductor switching device for switching a rectified output rectified by the rectifier, and a radiation fin for cooling the rectifier and semiconductor switching device, and is constructed so that the attaching position of the rectifier to the radiation fin is set so that the outer shape of the rectifier package protrudes from the outer shape of the radiation fin.

Thereby, the contact area between the rectifier and radiation fin is reduced, and heat quantity conducted from the rectifier to the semiconductor switching device is reduced. Therefore, without using an expensive semiconductor switching device with a lower loss and without using a number of radiation fins, an inexpensive switching power supply for a high frequency heating apparatus which can restrict the junction temperature of the semiconductor switching device within a temperature that is permissible in terms of reliability by use of one radiation fin can be provided.

BRIEF DESCRIPTION OF PREFERRED EMBODIMENTS

Figure 16:
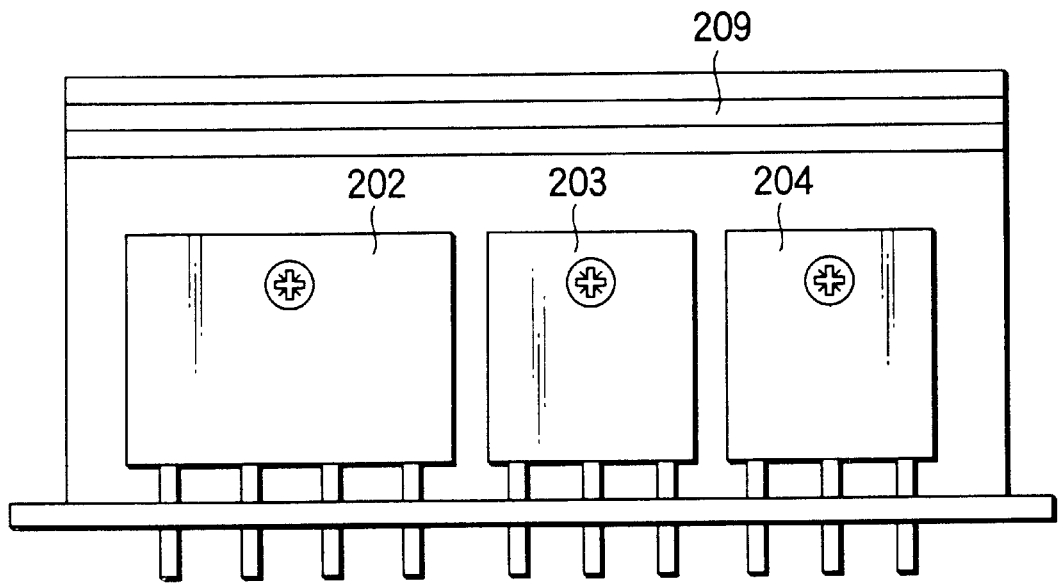
Figure 17:
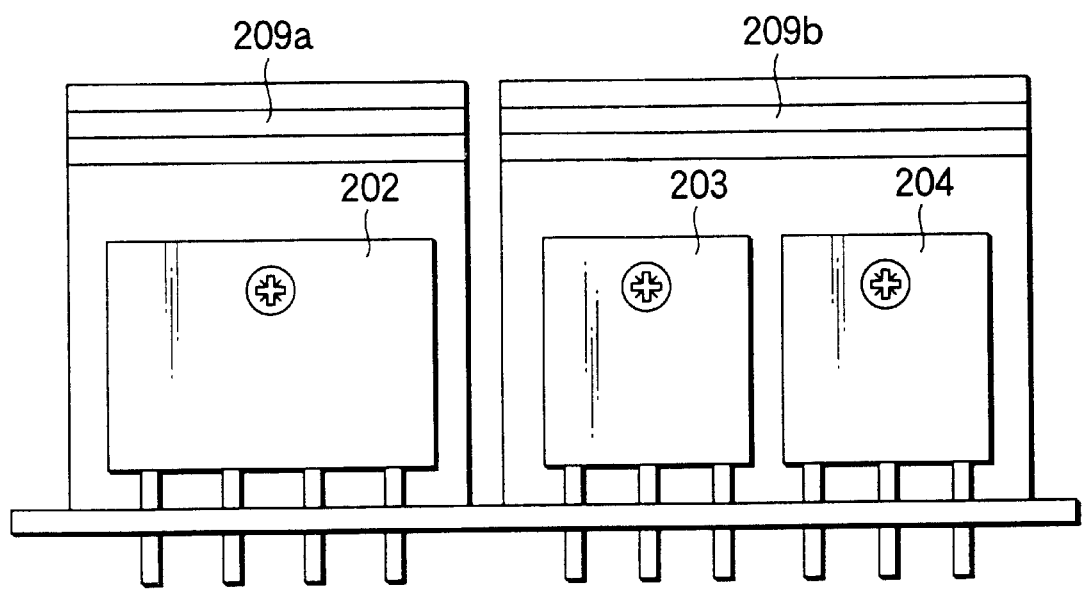

FIG. 16 is a block diagram showing the attachment of the rectifier and semiconductor switching devices to the radiation fin in a conventional switching power supply for a high frequency heating apparatus; and FIG. 17 is another block diagram showing the attachment of the rectifier and semiconductor switching devices to the radiation fin in the conventional switching power supply for a high frequency heating apparatus.

DETAILED DESCRIPTION OF THE PREFERRED EMBODIMENTS

Hereinafter, a description is given of embodiments of the invention with reference to the accompanying drawings.

FIRST EMBODIMENT

Figure 1:
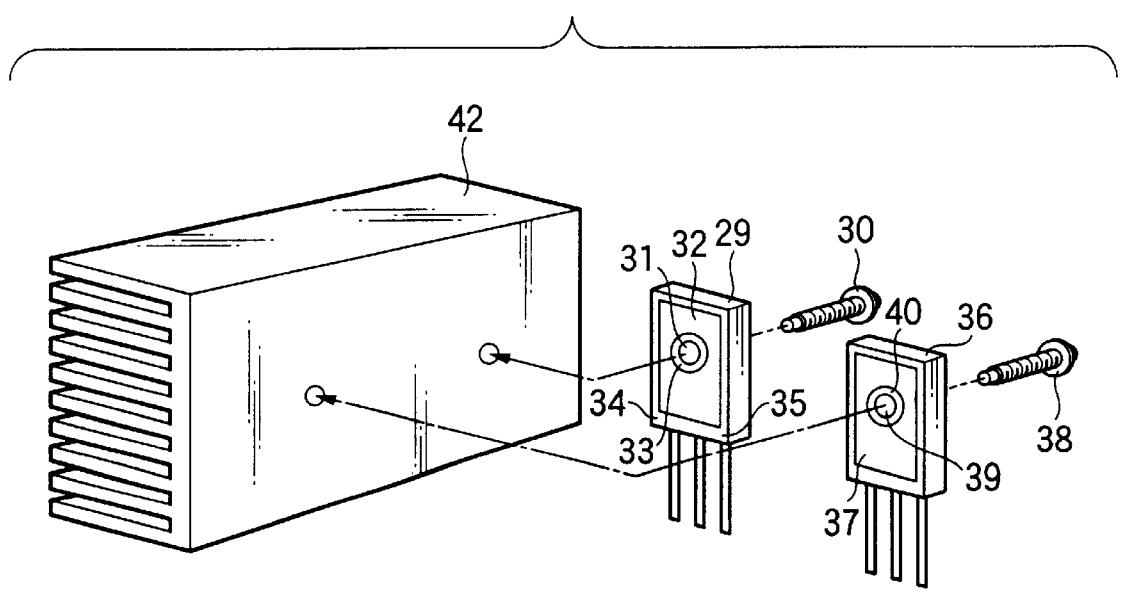
FIG. 1 is a perspective view showing the major parts of a power unit for driving a magnetron according to a first embodiment of the invention.
Figure 2:
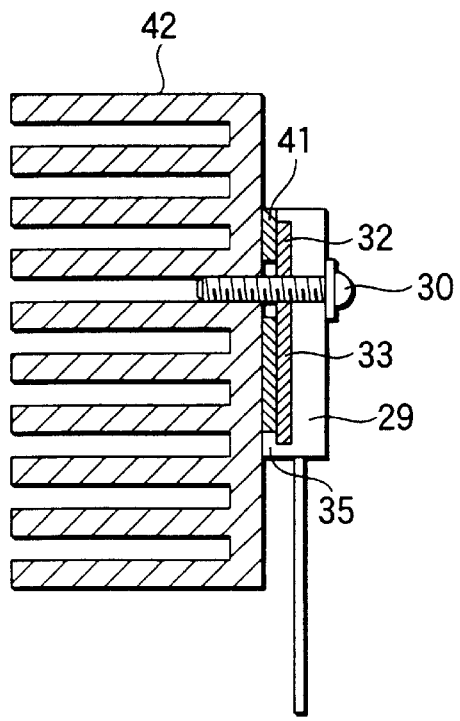
FIG. 2 is a sectional view showing the major parts of the same power unit for driving a magnetron.

FIG. 1 is a perspective view showing the major parts of a power unit for driving a magnetron according to a first embodiment of the invention. FIG. 2 is a sectional view showing the major parts of the same power unit for driving a magnetron. In FIG. 1, on the rear side of the semiconductor switching element 29, a spacer 33 that has a height of 1 mm or less from the plane of the exposed collector part 32 and is composed of an insulative synthetic resin constituting the armor of the semiconductor switching element 29 is provided around the hole 31 into which a screw 30 is inserted. Also, spacers 34 and 35 that have a height of 1mm or less from the plane of the exposed collector part 32 and is composed of an insulative synthetic resin constituting the armor are provided at both sides of the lower part of the armor of the same rear side. The collector part 37 is exposed on the rear side of another semiconductor switching element 36, and an insulative plane 40 that has the same height as the plane of the exposed collector part 37 and is composed of an insulative synthetic resin constituting the armor of the semiconductor switching element 29 is provided around a hole 39 into which a screw 38 is inserted. A thermal conducting filler 41 is coated on and filled in the rear side of the semiconductor switching element 29, a heat radiating fin 42 is attached by a screw 30, a thermal conducting filler 41 is coated on the collector part 37 exposed on the rear side of another semiconductor switching element 36, and the collector part 37 is attached to the same heat radiating fin 42 by a screw 38. Furthermore, the two semiconductor switching elements are connected to each other in series.

A description is given of operations and actions of the power unit for driving a magnetron, which is thus constructed.

First, even if the exposed collector part 32 of one semiconductor switching element 29 is attached to the heat radiating fin 42 by the screw 30, the collector part 32 is electrically insulated from the heat radiating fin 42 by spacers 33, 34 and 35. Since a thermal conducting filler is coated and filled in view of thermal conductivity, heat resulting from switching losses can be effectively transmitted to the heat radiating fin 42. Also, a thermal conducting filler is coated and filled in the collector part 41 exposed to the rear side of another semiconductor switching element 36, and the collector part 37 is attached to the same heat radiating fin 42 by a screw 38. Therefore, heat resulting from switching losses can be effectively transmitted to the heat radiating fin 42.

As described above, in the present embodiment, the exposed collector part 32 of one semiconductor switching element 29 is attached to the heat radiating fin 42 by coating and filling a thermal conducting filler 41 therebetween via spacers 33, 34 and 35, and the exposed collector part 37 of another semiconductor switching element 36 is directly attached to the same heat radiating fin 42 by coating and filling the thermal conducting filler 41 therebetween without any spacer. Further, the two semiconductor switching elements are connected to each other in series. Therefore, heat resulting from switching losses of the respective semiconductor switching elements 29 and 36 can be effectively transmitted to the heat radiating fin 42, wherein the heat radiating fin 42 can be made singular in constructing the power unit for driving a magnetron, and since heat resulting from switching losses can be effectively transmitted to the heat radiating fin, a cooling fan can be made small.

Figure 5:
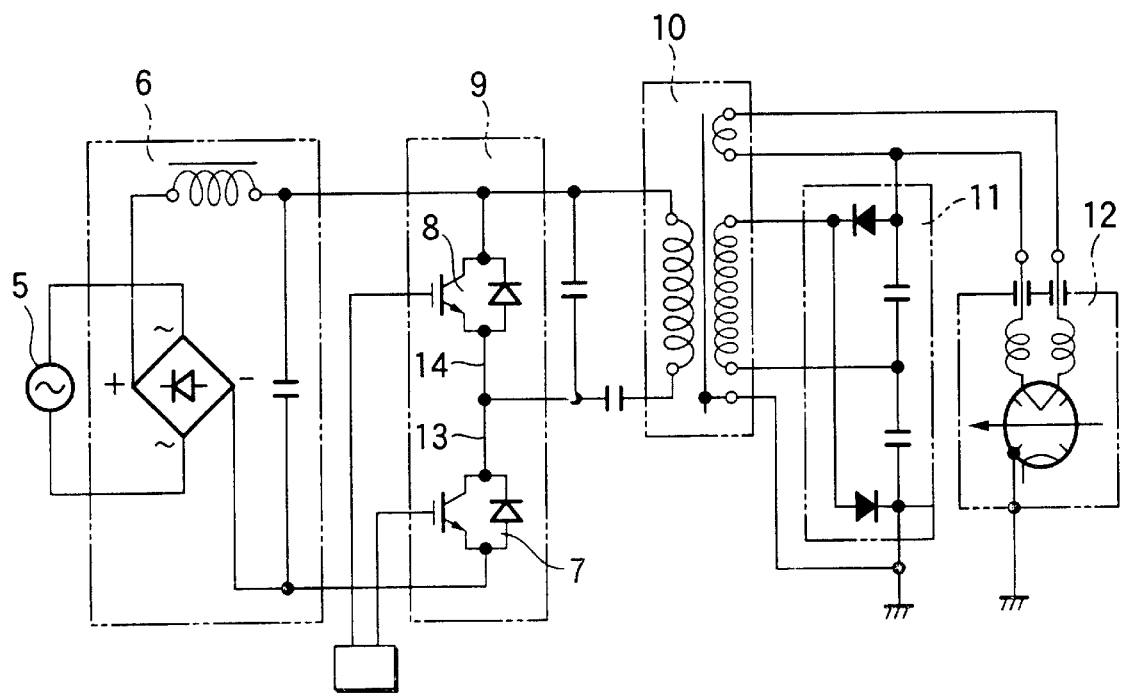
FIG. 5 is a circuit diagram of a power unit for driving a magnetron according to prior arts.
Figure 6:
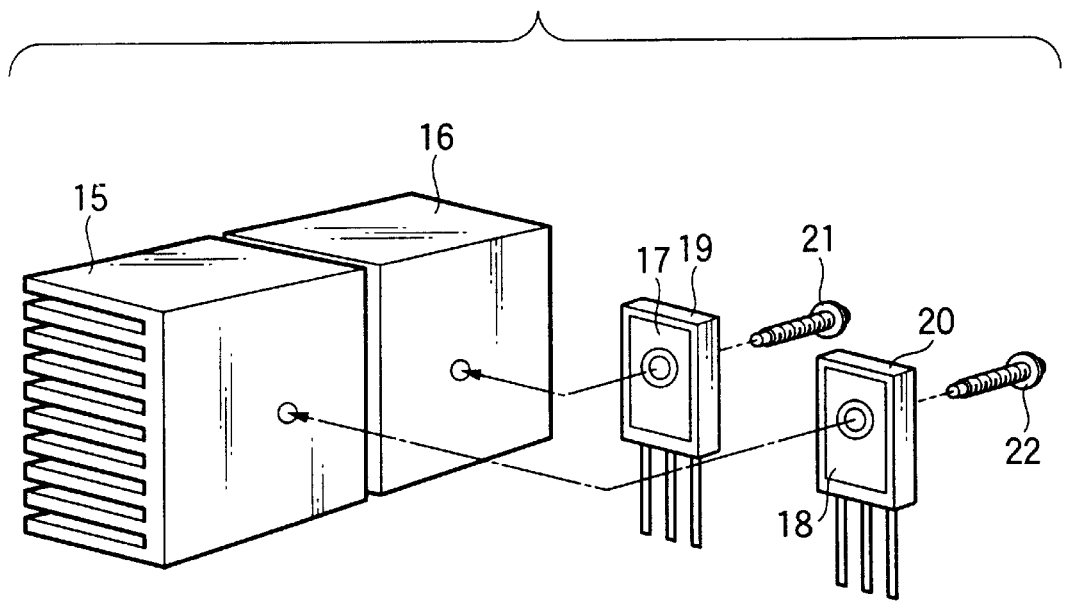
FIG. 6 is a perspective view showing the major parts of a power unit for driving a magnetron according to prior arts.
Figure 7:
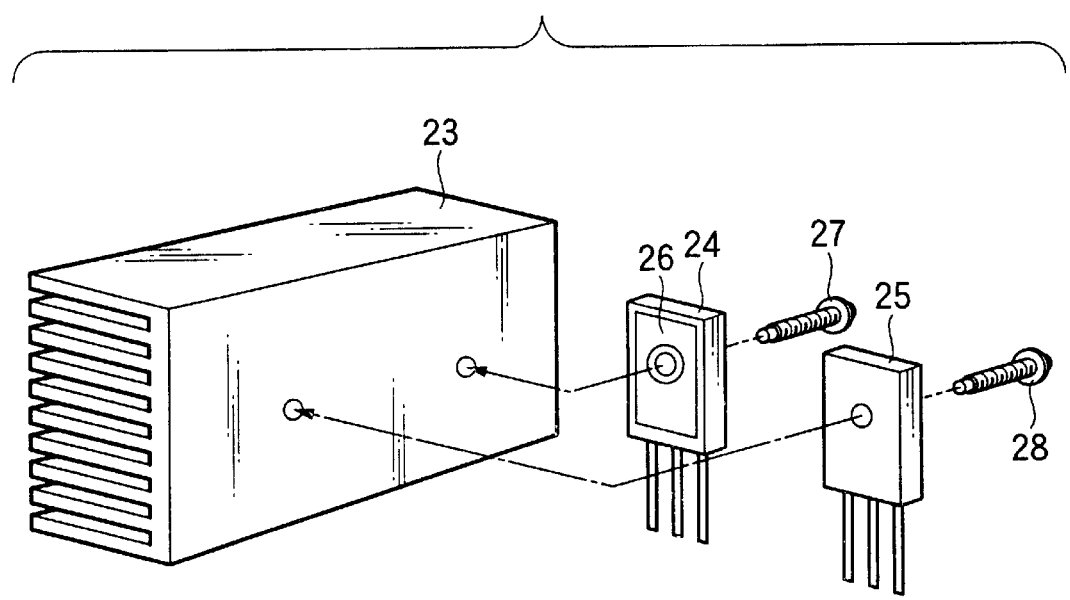
FIG. 7 is a perspective view showing the major parts of a power unit for driving a magnetron according to prior arts.

Also, in the embodiment, in the circuit diagram of FIG. 5 in which two semiconductor switching elements are connected to each other in series even if any one of two semiconductor switching elements is provided with a spacer and two semiconductor switching elements are attached to a single heat radiating fin by screws, a voltage applied between spacers of one semiconductor switching element in which, for example, spacers are provided, becomes a voltage between the collector of the semiconductor switching element and the emitter thereof. To the contrary, even if spacers are provided in the semiconductor switching elements 8 and two semiconductor switching elements are attached to a single heat radiating fin by screws, a voltage applied between spacers of the semiconductor switching elements becomes a voltage between the collector of the same semiconductor switching element and the emitter thereof.

Therefore, it can be said that even if spacers are provided in any one of the semiconductor switching elements, the height between the spacers, that is, between the collector part exposed on the rear side and the heat radiating fin may be such that the same can stand against a voltage between the collector of the semiconductor switching element 8 and the emitter thereof.

Further, although, in the embodiment, a spacer 33 is provided around a hole 31, into which a screw 30 is inserted, on the rear side of the semiconductor switching element 29, and spacers 34 and 35 are provided at both sides of the underside of the armor of the same rear side, it is needless to say that it is advantageous for a spacer to be installed at a semiconductor switching element generating less heat, dependant upon the degree of heat generation resulting from switching losses, with respect to which of the two semiconductor switching elements a spacer is provided.

In addition, in the embodiment, a spacer is installed at three places in any one of the two semiconductor switching elements. However, with respect to the number and shape of the spacers, it is needless to say that there is no limitation as long as the plane of installation of the collector part exposed on the rear side and the heat radiating fin can be kept at an almost uniform height when the semiconductor switching element is attached by a screw.

Figure 3:
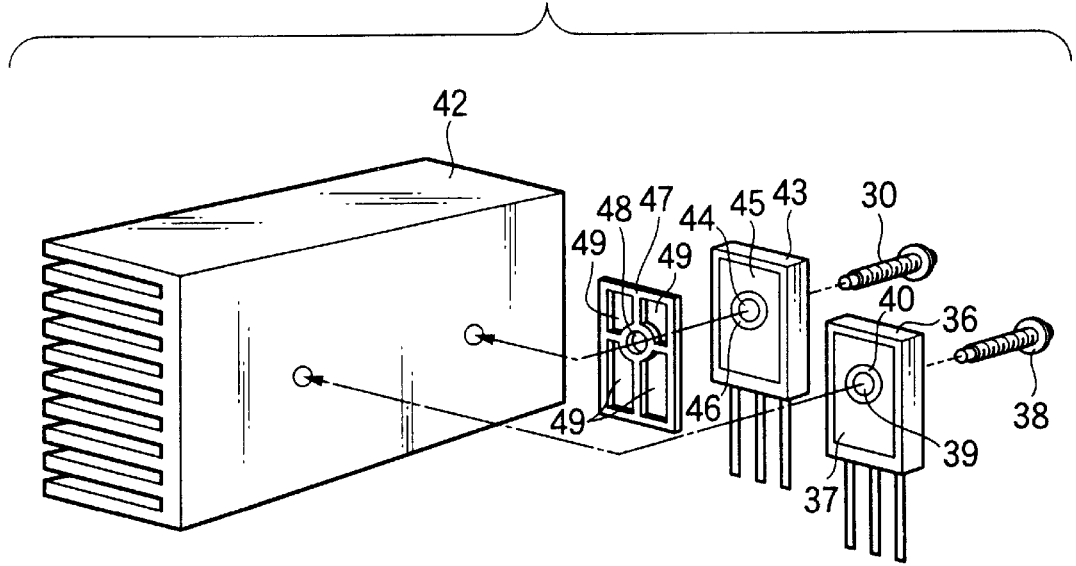
FIG. 3 is a perspective view showing the major parts of a power unit for driving a magnetron according to modification of the first embodiment of the invention.
Figure 4:
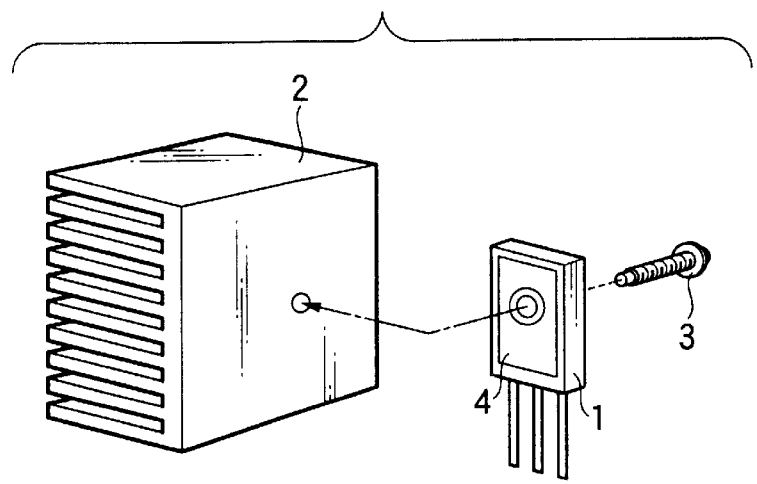
FIG. 4 is a perspective view showing the major parts of a power unit for driving a magnetron according to prior arts.

FIG. 3 is a perspective view showing the major parts of a power unit for driving a magnetron according to a modification of the embodiment of the invention. In FIG. 3, 47 denotes a spacer, 48 denotes an attaching hole, and 49 is a hole. A difference from the construction of the first embodiment resides in that a spacer is provided separately from the semiconductor switching elements, and thermal conductivity of the spacer is made to be 0.5 through $1.5 \times 10^{-3}$ cal/cm.sec.K. Also, parts that have the same reference numbers as those in the first embodiment have the same structure, and description thereof is omitted.

First, collector parts 37 and 45 are exposed from two semiconductor switching elements 40 and 43. Also, the spacer is composed of a material whose thermal conductivity is 0.5 through $1.5 \times 10^{-3}$ cal/cm.sec.K. The spacer 47 is provided with a hole 48 corresponding to the hole 44 into which a screw 30 of the semiconductor switching element 43 is inserted. A plurality of holes 49 in which a thermal conducting filler 41 is filled are provided at the periphery of the hole 48.

When attaching the semiconductor switching element 43 to the heat radiating fin 42 by a screw, a thermal conducting filler 41 is coated and filled between the semiconductor switching element and the heat radiating fin with the spacer 47 intervened, and the semiconductor switching element is attached to the heat radiating fin. The semiconductor switching element 36 has the same attaching structure as that in the first embodiment, wherein a description thereof is omitted. Thus, even if the exposed collector part 45 of one semiconductor switching element 43 is attached to the heat radiating fin 42 by a screw 30, the collector part 45 is electrically insulated from the heat radiating fin 42 by the spacer, and since a thermal conducting filler 41 is coated on and filled in the spacer, heat resulting from switching losses can be effectively transmitted to the heat radiating fin 42 in view of thermal conductivity. Further, since a thermal conducting filler 41 is coated on the collector part 37 exposed on the rear side of another semiconductor switching element 36, and the collector part 37 is attached to the same heat radiating fin 42 by a screw 38, heat resulting from switching losses can be effectively transmitted to the heat radiating fin 42.

As described above, in the present embodiment, the exposed collector part 45 of one semiconductor switching element 43 is attached to the heat radiating fin 42 via the spacer 47 with the thermal conducting filler 41 coated and filled therein, and the exposed collector part 37 of another semiconductor switching element 36 is attached to the same heat radiating fin 42 without any spacer with the thermal conducting filler 41 directly coated thereon. Further, the two semiconductor switching elements are connected to each other in series. Therefore, heat resulting from switching losses of the respective semiconductor switching elements 43 and 36 can be effectively transmitted to the heat radiating fin 42, wherein the number of heat radiating fins 42 can be made single in constructing a power unit for driving a magnetron. Since heat resulting from switching losses can be effectively transmitted to the heat radiating fin, the cooling fan can be made small.

Also, in the embodiment, the spacer is composed of a material whose thermal conductivity is 0.5 through $1.5 \times 10^{-3}$ cal/cm.sec.K. Further, the spacer is provided separately from the semiconductor switching elements, wherein since a synthetic resin or mica may be used as the material, resin molding, release from molds, and mechanical work such as hole preparation, etc., can be facilitated.

SECOND EMBODIMENTS

The second embodiment of the invention are described below with reference to the drawings.

FIG. 8 is a configuration diagram of a heat sink unit for assembly on a printed circuit board according to second embodiment of the invention. Identical numerals in the prior art designate identical components, and hence a detailed description is omitted.

Figure 8A:
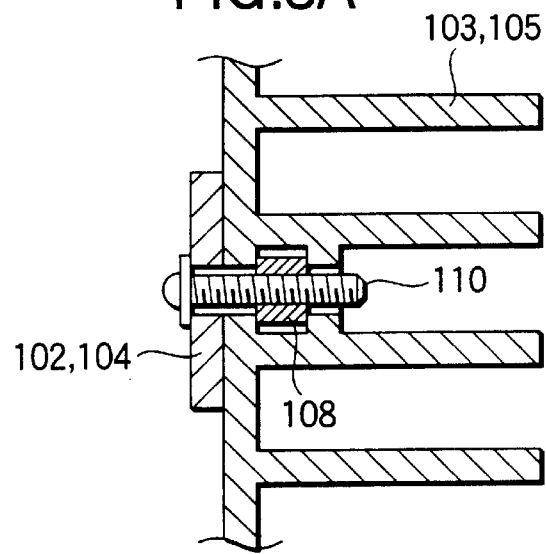
FIG. 8A is a cross sectional view of a heat sink unit for assembly on a printed circuit board according to second embodiment of the invention.
Figure 8B:
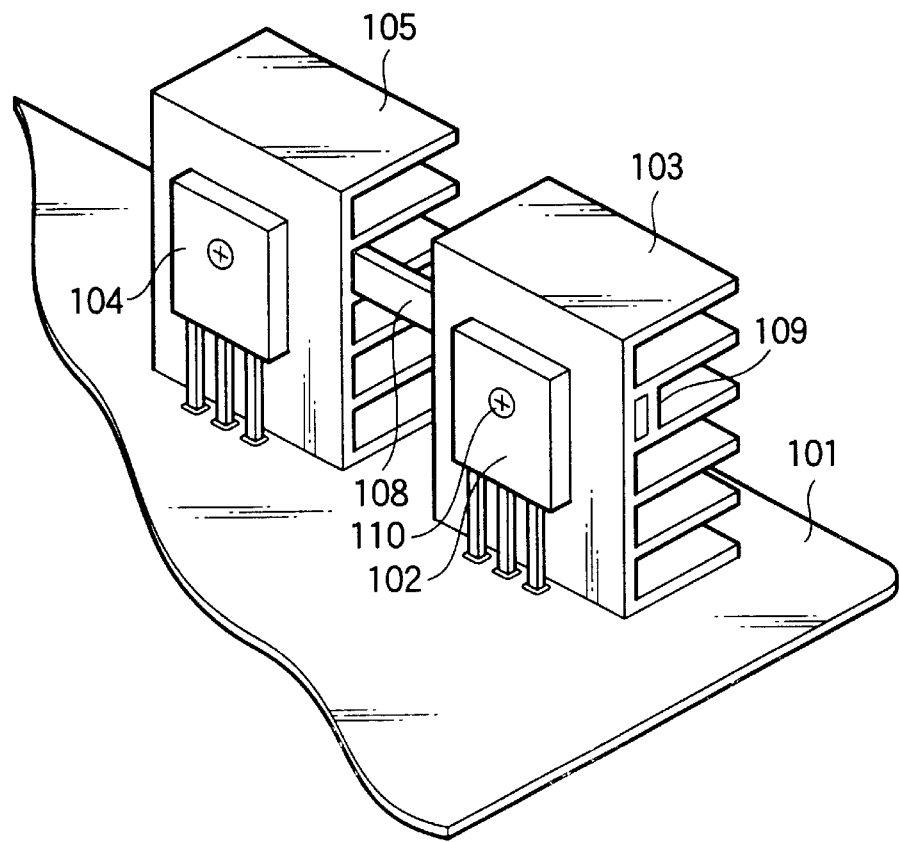
FIG. 8B is an assembly diagram of a heat sink unit for assembly on a printed circuit board according to the second embodiment of the invention.

In FIG. 8B, numeral 103 indicates a first heat sink fabricated by extrusion molding using a die. The first heat sink 103 has a guide section 109 for temporarily retaining an insulator 108 having thermal conductivity. The insulator 108 having thermal conductivity which is temporarily retained along the guide section 109 is attached to the first power semiconductor device 102 and the first heat sink 103 simultaneously by a screw 110. Numeral 105 indicates a second heat sink fabricated by extrusion molding using the same die. The second heat sink 105 is separated from the first heat sink 103 by a predetermined insulation distance. The insulator 108 having thermal conductivity is similarly attached to the second power semiconductor device 104 and the second heat sink 105 simultaneously.

Here, as shown in FIG. 8A, an insulation spacing is provided between the heat sink 103 or 105 and the screw 110.

Described below are the operation and effect of the heat sink unit for assembly on a printed circuit board which has the above-mentioned configuration.

The power loss in the first power semiconductor device 102 is released through the thermal resistance between the junction of the first power semiconductor device 102 and the heat sink surface, to the first heat sink 103. At the same time, the power loss is released from the first heat sink 103, through the thermal resistance between the heat sink and the insulator, to the insulator 108.

Similarly, the power loss in the second power semiconductor device 104 is released to the second heat sink 5 and the insulator 108. The first and second heat sinks 103 and 105 are thermally linked through the insulator 108 having thermal conductivity.

At the same time, the first and second heat sinks 103 and 105 are also linked physically through the insulator having thermal conductivity.

As such, in the present example, the insulator 8 having thermal conductivity is attached to the first and second power semiconductor devices 102, 104 and the heat sinks 103, 105 simultaneously by screws 110. Accordingly, the first and second power semiconductor devices 102, 104 and the heat sinks 103, 105 are linked to each other physically and thermally. This reduction in the number of components improves the assembly workability. Further, the thermal linkage improves the heat radiation efficiency.

The present example has been described for the case where the first and second heat sinks 103 and 105 are fabricated by the same die. However, even in a case where the first and second heat sinks are in different forms, similar operation and effect are obtained.

Further, the present example has been described for the case where the insulator 108 having thermal conductivity is attached to the first and second power semiconductor devices 102, 104 and the heat sinks 103, 105 simultaneously by screws 110. However, the first and second power semiconductor devices 102, 104 and the sinks 103, 105 may be attached simultaneously by screws, and further the insulator 108 may be attached to the first and second heat sinks 103 and 105 by screws or mechanical engagement. Also in this case, similar operation and effect are obtained.

(Modification)

Figure 9:
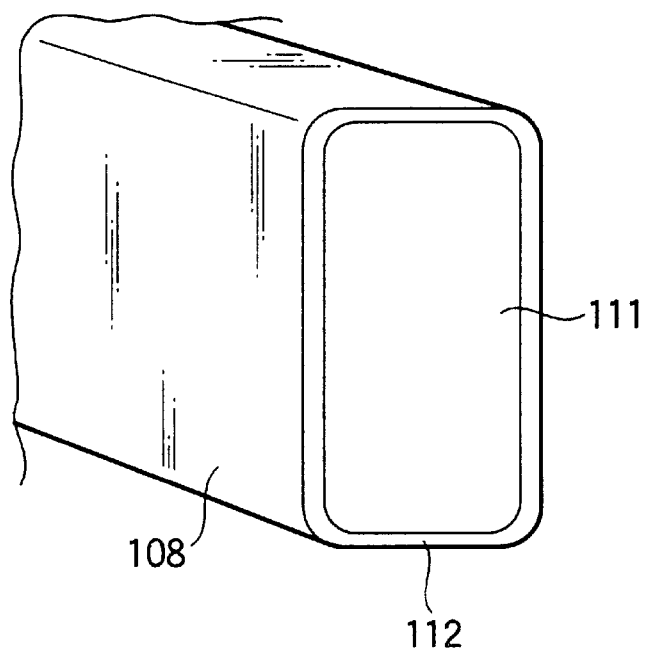
FIG. 9 is a configuration diagram of an insulator in a heat sink unit for assembly on a printed circuit board according to a modification of the second embodiment of the invention.

FIG. 9 is a configuration diagram of an insulator 108 having thermal conductivity in a heat sink unit for assembly on a printed circuit board according to a modification of the second embodiment of the invention. In FIG. 9, numeral 111 indicates a metal section in the insulator 108. Numeral 112 indicates a thin insulator film in the insulator 108. The thin insulator film is composed of a polyimide film in the present example. Identical numerals to the above mentioned second embodiment designate identical components, and hence a description is omitted.

As such, in the present example, the insulator 108 has a double layered structure composed of a metal section 111 and a thin insulator film 112. This improves the thermal conductivity in the insulator 108 and hence the heat radiation efficiency through the thermal linkage. This, in turn, permits a reduction in the area of the insulator 108.

In the present example, a polyimide film has been used. However, a mica film or an insulation paper sheet may be used. Also in this case, similar operation and effect are obtained.

(Another modification)

Figure 10:
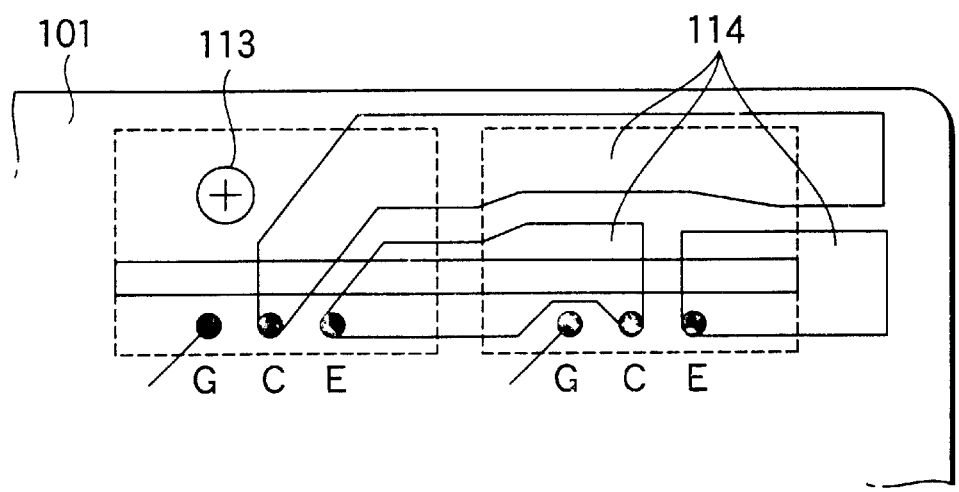
FIG. 10 is a diagram of the printed circuit pattern of a printed circuit board in a heat sink unit for assembly on a printed circuit board according to another modification of the second embodiment of the invention.
Figure 11:
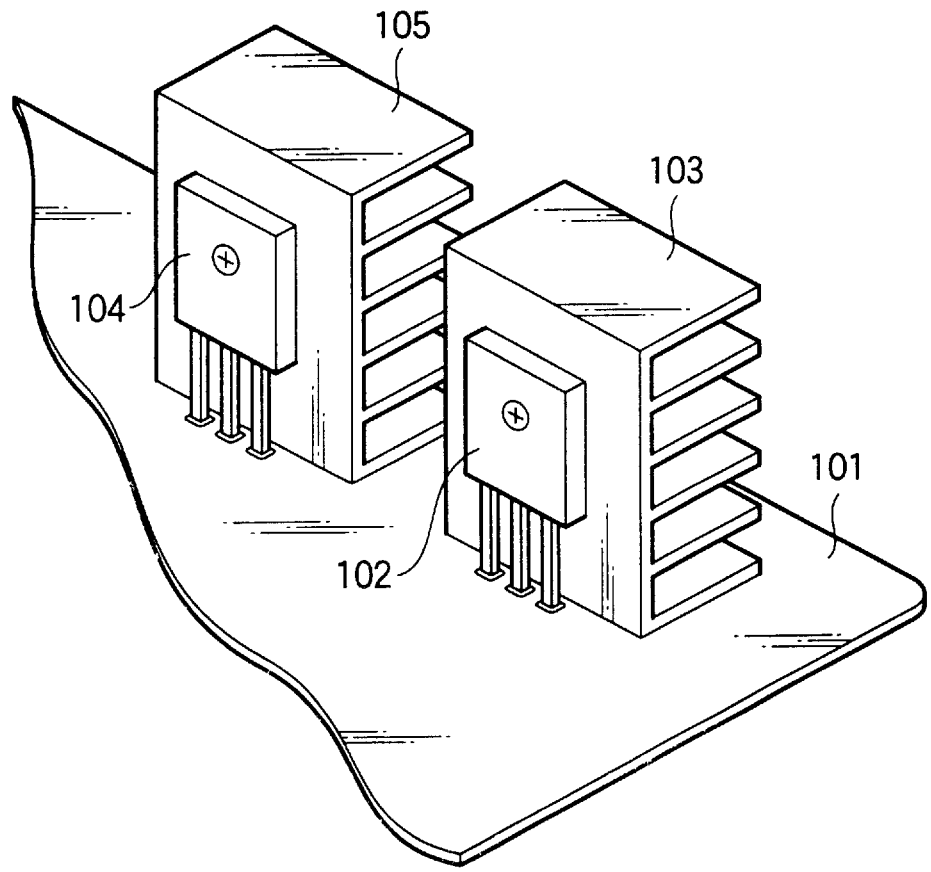
FIG. 11 is an assembly diagram of a heat sink unit for assembly on a printed circuit board according to the prior art.

FIG. 10 is a diagram of the printed circuit pattern of a printed circuit board in a heat sink unit for assembly on a printed circuit board according to another modification of the second embodiment of the invention.

Numeral 113 indicates a screw for attaching a heat sink to the printed circuit board. Numeral 114 indicates a printed circuit pattern.

Figure 12:
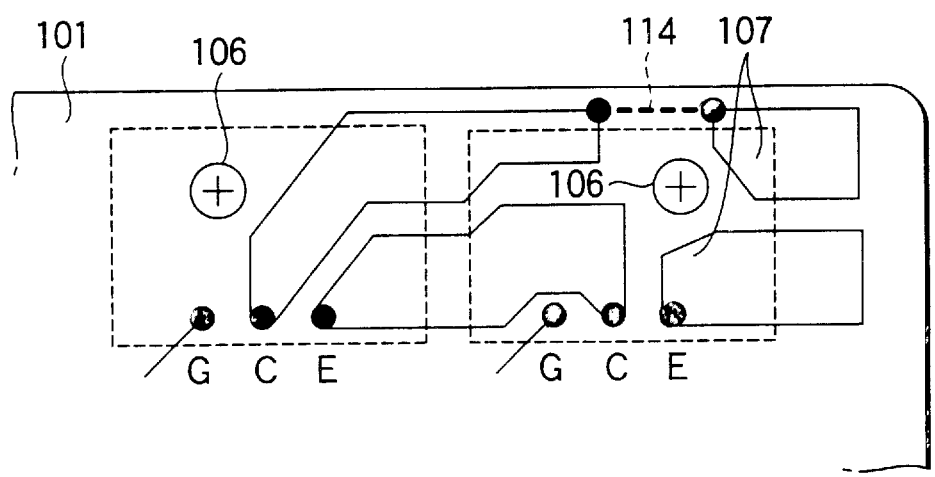
FIG. 12 is a diagram of the wiring print pattern of a printed circuit board in a heat sink unit for assembly on a printed circuit board according to the prior art.

In comparing FIG. 10 with FIG. 12 showing the prior art, the collector (C in the figure) of a power semiconductor device 102 or 104 such as an IGBT is generally at the potential of a heat sink. Accordingly, the screw 106 or 113 needs to be separated from the potential of the gate (G in the figure) and the potential of the emitter (E in the figure) other than the potential of the collector by a predetermined insulation distance. In the prior art, at least two screws 106 are necessary. In contrast, in the invention, a single screw 113 is sufficient because the two heat sinks 103 and 105 are physically linked by the insulator 108. This avoids the necessity of one of the screws 106 and the insulation distance thereof, and thereby facilitates sufficient area in the printed circuit board 101.

Further, the invention avoids the necessity of a lead wire 114 for current capacity supplement which has been added in order to resolve the insufficiency in the wiring print pattern width caused by the screw 6 and the insulation distance thereof. Thus, the wiring print pattern is solely sufficient. As such, this facilitates a reliable area of the wiring print pattern within the area of the printed circuit board.

In the case where a device with an insulation package, such as a rectifier diode bridge, is assembled additionally on the heat sink, the mechanical strength of the assembling to the printed circuit board is increased, whereby the operation and effect of the invention is enhanced.

THIRD EMBODIMENT

A third embodiment of the invention is explained with reference to FIG. 13, FIG. 14, and FIG. 15.

Figure 15:
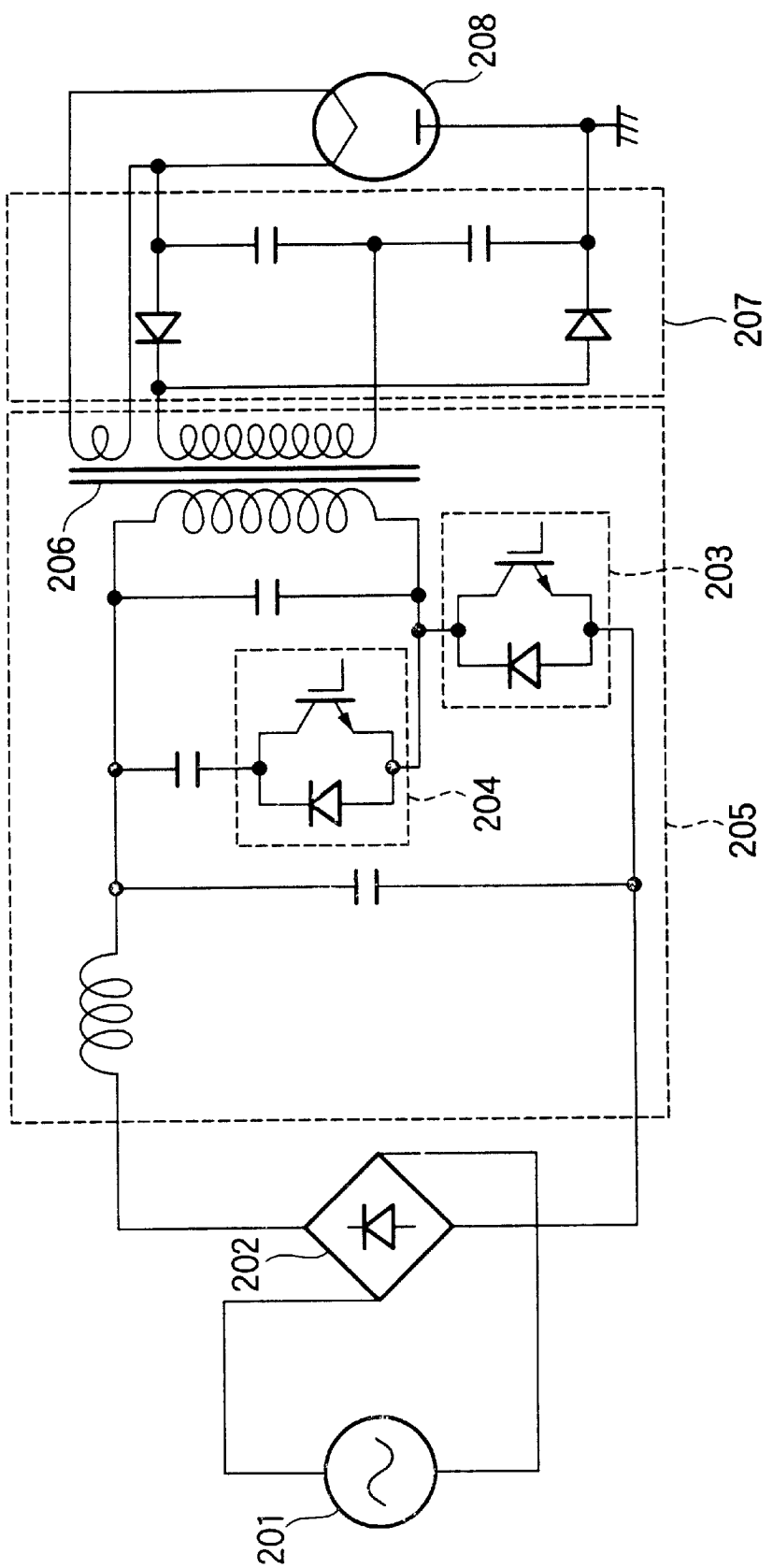
FIG. 15 is a circuit diagram of a switching power supply for a high frequency heating apparatus according to third embodiment of the invention and the conventional example.

FIG. 15 explained in the conventional example is also a circuit diagram showing a switching power supply for a high frequency heating apparatus in the example of the invention. An alternating current of the commercial power supply 201 is converted into a DC voltage by the rectifier 202, and in response to this DC voltage, the inverter circuit 205 generates a high frequency voltage to the primary winding of the high voltage transformer 206 by turning the semiconductor switching devices 203 and 204 ON and OFF, and the high voltage transformer 206 excites a high frequency high voltage to the secondary winding. This high frequency high voltage is rectified into a DC high voltage by the high voltage rectifying circuit 207, and applied to the magnetron 208. The magnetron 208 is driven by this DC high voltage, and generates a radio wave of 2.45 GHz.

Figure 13:
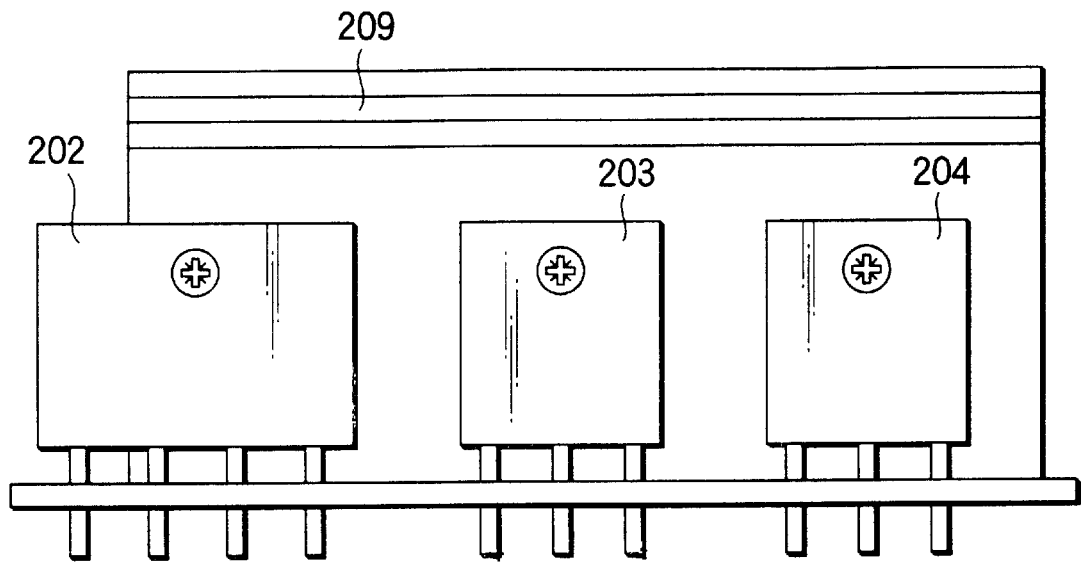
FIG. 13 is a block diagram showing the attachment of the rectifier and semiconductor switching devices to the radiation fin in a switching power supply for a high frequency heating apparatus according to third embodiment of the invention.

FIG. 13 is a block diagram showing attachment of the rectifier 202 and semiconductor switching devices 203 and 204 to the radiation fin 209. By the abovementioned operation, the rectifier 202 generates an approximately 15 through 25 W loss, and the semiconductor switching devices 203 and 204 generate an approximately 30 through 50W loss each. Therefore, although the rectifier 202 and semiconductor switching devices 203 and 204 are attached to the radiation fin 209 for cooling, different from the conventional example, the attachment is carried out so that the package outer shape of the rectifier 202 protrudes from the outer shape of the radiation fin 209.

The operation and action of the switching power supply for a high frequency heating apparatus thus constructed are explained below.

First, the semiconductor switching devices 203 and 204 generates a loss that is almost twice as much as that of the rectifier 202, so that in proportion to the loss, each junction temperature of the semiconductor switching devices 203 and 204 is naturally higher than that of the rectifier 202. Furthermore, since the rectifier 202 and semiconductor switching devices 203 and 4 are attached to the same radiation fin 209, the semiconductor switching devices 203 and 204 receive heat from the rectifier 202 due to heat conduction, and each junction temperature of the semiconductor switching devices 203 and 204 rises further. However, since the rectifier 202 is attached to the radiation fin 209 so that the package outer shape protrudes from the outer shape of the radiation fin 202, the contact area between the rectifier 202 and radiation fin 209 is reduced, and in proportion to this, the heat quantity conducted to the semiconductor switching devices 203 and 204 is also reduced. Therefore, each junction temperature of the semiconductor switching devices 203 and 204 can be restricted within a temperature that is permissible in terms of reliability. On the other hand, in accordance with a reduction in contact area between the rectifier 202 and radiation fin 209, the radiation effect of the rectifier 202 deteriorates, and the junction temperature of the rectifier 202 rises. However, the loss is originally small, so that the temperature can be restricted within a temperature that is permissible in terms of reliability.

Figure 14:
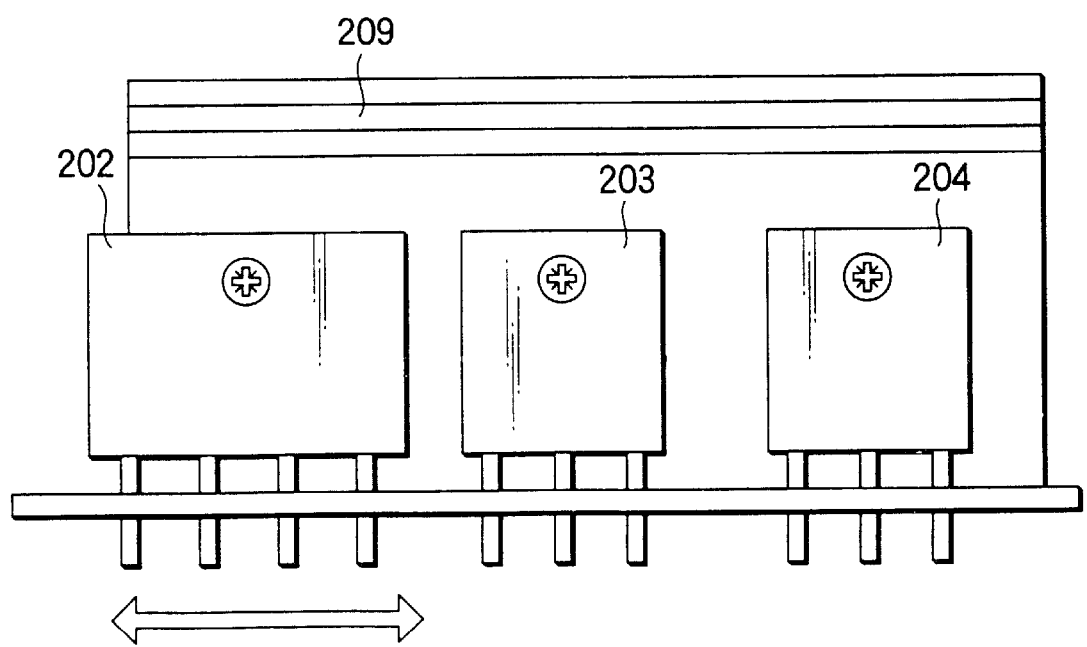
FIG. 14 is another block diagram showing the attachment of the rectifier and semiconductor switching devices to the radiation fin in the same switching power supply for a high frequency heating apparatus.

FIG. 14 is also a block diagram showing the attachment of the rectifier 202 and semiconductor switching devices 203 and 204 to the radiation fin 209. As shown in this figure, by changing the attaching position of the rectifier 202 to the radiation fin 209, the dimensions of the package outer shape of the rectifier 202 protruding from the outer shape of the radiation fin 209 can be changed, so that the contact area between the rectifier 202 and radiation fin 209 can be changed. Thereby, for example, when the junction temperature of the rectifier 202 becomes higher than a temperature that is permissible in terms of reliability, and each junction temperature of the semiconductor switching devices 203 and 204 becomes within the temperature that is permissible in terms of reliability, the attaching position is changed in a direction in which the contact area between the rectifier 202 and radiation fin 209 increases, whereby each junction temperature of the rectifier 202 and semiconductor switching devices 203 and 204 can be suppressed within the temperature that is permissible in terms of reliability. Thus, by optimizing the contact area between the rectifier 202 and radiation fin 209, each junction temperature of the rectifier 202 and semiconductor switching devices 203 and 204 can be suppressed within the temperature that is permissible in terms of reliability.

As mentioned above, according to the invention, the attaching position of the rectifier 202 to the radiation fin 209 is set so that the package outer shape of the rectifier 202 protrudes from the outer shape of the radiation fin 209, whereby the contact area between the rectifier 202 and radiation fin 209 is reduced, and a heat quantity conducted from the rectifier 202 to the semiconductor switching devices 203 and 204 is reduced. Therefore, without using expensive semiconductor switching devices with a lower loss, and without using a number of radiation fins, an inexpensive switching power supply for a high frequency heating apparatus which can suppress each junction temperature of the semiconductor switching devices 203 and 204 within a temperature that is permissible in terms of reliability by use of only one radiation fin 209 can be provided.

As described above, according to the first aspect of the invention, since the exposed collector part of one semiconductor switching element is electrically insulated from a heat radiating fin by a spacer, and a thermal conducting filler is coated and filled therein in view of thermal conductivity, heat resulting from switching losses can be effectively transmitted to the heat radiating fin, wherein the number of heat radiating fins can be made single in constructing a power unit for driving a magnetron. Therefore, since heat resulting from switching losses can be effectively transmitted to a heat radiating fin, a cooling fan can be made small.

Further, the invention according to the second aspect of the invention, it is provided a heat sink unit for assembly on a circuit printed board capable of reducing the number of assembly processes, permitting easy design in the heat radiation of power semiconductor devices, facilitating the area of the wiring print pattern, and thereby improving the accommodation reliability Furthermore, according to third aspect of the invention, a switching power supply for a high frequency heating apparatus which can restrict the temperatures of semiconductor switching devices within a temperature that is permissible in terms of reliability by a simple and inexpensive structure can be provided.

What is claimed is:

1. A power unit for driving a magnetron, comprising: semiconductor switching elements;
a heat radiating fin;
a spacer; and
a thermal conducting filler,
wherein said semiconductor switching elements have a collector part exposed on the rear side thereof, the exposed collector part of one semiconductor switching element is coated and filled with said thermal conducting filler via said spacer and is attached to said heat radiating fin, the exposed collector part of another semiconductor switching element is directly coated with said thermal conducting filler with no space intervened, and is attached to the same heat radiating fin, and further the two semiconductor switching elements are connected to each other in series.

2. The power unit for driving a magnetron as claimed in claim 1, wherein the two semiconductor switching elements have a collector part exposed thereon, a spacer projecting from the plane of the collector part is constituted on one collector part side thereof, and a thermal conducting filler is coated and filled in an air gap between the collector part of said semiconductor switching elements and the heat radiating fin.

3. The power unit for driving a magnetron as claimed in claim 1, wherein two or more holes are provided in a spacer whose thermal conductivity is 0.5 through $1.5 \times 10^{-3}$ cal/cm.sec.K, and a thermal conducting filler is coated and filled in said holes of the spacer.

4. A heat sink unit for assembly on a circuit printed board comprising:
a circuit printed board;
a plurality of heat sinks assembled on said circuit printed board;
a plurality of power semiconductor devices with electrically non-insulating packages each mounted on a separate one of said plurality of heat sinks; and
an electrical insulator having substantial thermal conductivity for thermally linking said heat sinks to each other.

5. A heat sink unit for assembly on a circuit printed board a claimed in claim 4, wherein said power semiconductor devices and said heat sinks are attached simultaneously together with said insulator having thermal conductivity by screws or the like.

6. A heat sink for assembly on a circuit printed board as claimed in claim 4, wherein said insulator having thermal conductivity is composed of a metallic material covered with a thin insulator film.

7. A heat sink unit for assembly on a circuit printed board as claimed in claim 4, wherein only one of said heat sinks is fixed to said circuit printed board by screws or the like.

8. A switching power supply for a high frequency heating apparatus, comprising:
a rectifier for rectifying a commercial power supply;
at least one semiconductor switching device for switching a rectified output rectified by the rectifier; and
a radiation fin for cooling the semiconductor switching device,
wherein the attaching position of the rectifier to the radiation fin is set so that the outer shape of the rectifier package protrudes from the outer shape of the radiation fin.

9. The heat sink unit of claim 4, wherein said power semiconductor devices and said heat sinks are connected together with said insulator thermally linked to said heat sinks using a mechanical fastener.

10. The heat sink of claim 6, wherein said thin film of an electrical insulator includes one or more of a paper, a mica, and a polyamide.

11. A heat sink unit for assembly on a circuit printed board comprising:

a circuit board;

a plurality of heat sinks assembled on said circuit board;

a plurality of power semiconductor devices each mounted on, and in both electrical and thermal contact with, a separate one of said plurality of heat sinks; and a means for thermally linking said heat sinks to each other and for electrically insulating said heat sinks from each other.

12. The heat sink unit of claim 11, wherein said electrical insulator includes a metallic material covered by a thin film of an electrical insulator.

13. The heat sink of claim 12, wherein said thin film of an electrical insulator includes one or more of an electrically insulating paper, mica, and polyamide.

* * * * *